United States Patent
Lopatinsky et al.

(10) Patent No.: US 7,265,974 B2
(45) Date of Patent: Sep. 4, 2007

(54) MULTI-HEATSINK INTEGRATED COOLING DEVICE

(75) Inventors: Edward Lopatinsky, San Diego, CA (US); Lev Fedoseyev, El Cajon, CA (US)

(73) Assignee: Industrial Design Laboratories Inc., San Diego, CA (US)

( * ) Notice: Subject to any disclaimer, the term of this patent is extended or adjusted under 35 U.S.C. 154(b) by 141 days.

(21) Appl. No.: 11/226,779

(22) Filed: Sep. 14, 2005

(65) Prior Publication Data

US 2006/0056153 A1   Mar. 16, 2006

Related U.S. Application Data

(60) Provisional application No. 60/610,329, filed on Sep. 16, 2004.

(51) Int. Cl.
*H05K 7/20* (2006.01)

(52) U.S. Cl. ............... 361/697; 361/695; 361/700; 165/80.3; 165/121; 174/16.3

(58) Field of Classification Search .......... 361/687, 361/690–699, 700, 703, 707–710, 717–720; 165/80.3, 80.4, 121–126, 104.33, 104.34; 257/715, 722; 174/15.2, 16.3; 454/184
See application file for complete search history.

(56) References Cited

U.S. PATENT DOCUMENTS

| | | | |
|---|---|---|---|
| 5,940,269 A * | 8/1999 | Ko et al. ................... | 361/697 |
| 6,525,940 B1 * | 2/2003 | Chen et al. ................ | 361/697 |
| 6,712,129 B1 * | 3/2004 | Lee ........................... | 165/104.21 |
| 6,717,811 B2 * | 4/2004 | Lo et al. .................... | 361/698 |
| 6,778,390 B2 * | 8/2004 | Michael ..................... | 361/695 |
| 6,798,663 B1 * | 9/2004 | Rubenstein ................ | 361/710 |
| 6,912,128 B2 * | 6/2005 | Bird et al. .................. | 361/695 |
| 2005/0061477 A1 * | 3/2005 | Mira ........................... | 165/80.3 |

* cited by examiner

*Primary Examiner*—Michael Datskovskiy

(57) ABSTRACT

A multi-heatsink integrated cooling device comprises a crossflow cooler and a primary heatsink thermally connected by heat-spreading means. The crossflow cooler comprises a casing with an inlet and an outlet, and a radial impeller and heat-exchanging means located inside of the casing. The casing comprises side parts, a cover and a lower plates contacted with the heat-exchanging means and first of the electronic components. The primary heatsink comprises housing and heat-exchanging members located inside of the housing. The housing comprises a base, sidewalls and a cover, thus forming inflow and outflow openings. The base contacted with the heat-exchanging members and second of the electronic components. The primary heatsink and the crossflow cooler located in such a way that the outflow opening is adjacent to the inlet, thus cooling air flows through the primary heatsink, the inlet, the heat-exchanging means, the radial impeller and the outlet in a series way.

8 Claims, 4 Drawing Sheets

MULTI-HEATSINK INTEGRATED COOLING DEVICE

CROSS REFERENCE TO RELATED APPLICATIONS

The present application claims the benefit of priority of U.S. Provisional Patent Application No. 60/610,329, filed Sep. 16, 2004 for Edward Lopatinsky at al. the entire content of which is incorporated herein by reference.

FIELD OF THE INVENTION

The present invention relates generally to cooling systems. More particularly, the present invention relates to the coolers for regulating the temperature of at least two electronic devices. The present invention is particularly, but not exclusively, useful for cooling systems that regulate the temperature of electronic components for blade servers where a multi processor scheme is used often.

BACKGROUND OF THE INVENTION

The regulation of the temperature of electronic components like processors due to heat generated inside the casing of an electronic device like a blade server is an important consideration during the design of an electronic device. Cooling is critical because if left unchecked, heat can cause electronic devices to malfunction during use or led to premature device failure. As improvements in processor clock speed occur, the amount of heat generated by the faster processors also increases. Additionally, improved processors require larger power supplies and auxiliary components that generate increased amounts of heat and require improved sophisticated systems for heat removal.

Another factor that aggravates the need for improved heat removal cooling systems is the trend towards making computing devices such as blade servers smaller and especially thinner. The trend toward smaller and thinner electronic devices having larger, faster processors renders the traditional heat removal cooling systems inadequate for several reasons. First, smaller devices having faster processors result in an increased density of heat producing by electronic components leading to higher heat flux. Second, a decreased amount of space is available for temperature regulating devices such as traditional heatsinks. Lastly, a decreased amount of space is available to create ventilation paths that pass through the heat-exchanging channels of the heatsink. Thus, traditional cooling systems with blower assembly having one blower with an inlet that ventilates the entire housing of the device and, accordingly, all electronic components are less effective or inapplicable for removing heat when used in smaller, thinner devices.

There are numerous designs trend of coolers for cooling of electronic components that include one common heatsink installed in the contact with at least two electronic devices. These coolers have usually one common blower.

The heatsink of such cooler should have full tight contact with the surfaces of all electronic components. But it is difficult to insure that every electronic component will be coupled to the heatsink evenly because of linear and angular dimensional tolerances from one electronic component to another. Some of them may not even be coupled at all to the heatsink, while excessive mechanical stress may be imparted to the others.

There have been proposed a number of solutions in the past tried to solve these problems. One such solution, described in U.S. Pat. No. 4,235,283 "Multi-stud thermal conduction module" employs captive pistons or other elements with springs within the heatsink to contact the electronic component and accommodate variances in the mechanical features and tolerances. This technique is mechanically complex and therefore costly.

Another technique described in U.S. Pat. No. 5,981,310 "Multi-chip heat-sink cap assembly" employs the use of thermally conductive material as solder or a thermal compound to fill the gaps between the electronic components and the heatsink. This technique is difficult to implement, and it does not give good enough contact between the heatsinks and electronic components.

It is known solution described in U.S. Pat. No. 5,184,211 "Apparatus for packaging and cooling integrated circuit chips" that employs cushions from elastic material between each of the electronic components and the heatsink.

This solution and all other solutions with one common heatsink for several electronic components have one common disadvantage—they cannot provide a good tight reliable interface contact with low thermal resistance between the heatsinks and electronic components compared to the separate heatsinks that are individually installed and tightened on each electronic component.

It is known the solution described in U.S. patent application Ser. No. 10/488,797 Edward Lopatinsky et al. This solution includes at least one heat-exchange element, at least one heat-spreading element as a heat pipe with an adapter and the blower. However this is an indirect cooling solution, needs to be much more space with the heat pipes located between the adaptor and the heatsink.

It is also known design for direct cooling described in U.S. patent application Ser. No. 10/696,617 Edward Lopatinsky et al. There are two separate heatsinks individually attached to the each electronic component. On the top of the heatsinks there is attached the integrated radial blower hydraulically connected to the both heatsinks from the inlet part of the blower. It is much better solution in terms of lower thermal interface resistance between electronic components and heatsinks; however there is a disadvantage for such cooling system.

The height or thickness of the solution is the sum of the heatsink and the blower sizes that is preventing to produce such designs in the lower thickness. There is another disadvantage of such systems based on the lack of thermal contact between heatsinks. These electronic devices almost never work simultaneously at the highest clock speed; therefore they would not create the highest possible heat at the same time. Since heatsinks are thermally separated, there is no temperature equalizing from one to another heatsink. In this case the heat cannot equally distribute between both heatsinks that obviously negatively affects the overall cooling performance.

It would be desirable to provide a multi-heatsink integrated cooling device that overcomes these problems associated with insufficient thermal efficiency at smaller sizes.

SUMMARY OF THE INVENTION

Accordingly, it is an object of the present invention to provide a multi-heatsink integrated cooling device for at least two electronic components, which is capable of significantly improving of cooler performances such as increased thermal efficiency.

In order to achieve this object, the multi-heatsink integrated cooling device comprises a crossflow cooler and at least one primary heatsink thermally connected by heat-spreading means. The crossflow cooler comprises a casing with an inlet and an outlet, and a radial impeller and heat-exchanging means located inside of the casing. The crossflow cooler supplied by an electric motor which could be made of any conventional types. The casing comprises two side parts, a cover plate and a lower plate provided a thermal contact with the heat-exchanging means and first of the electronic components.

The primary heatsink comprises a housing and heat-exchanging members located inside of the housings. The housing comprises a base, two sidewalls and a cover, thus forming inflow and outflow openings, the base provided a thermal contact with the heat-exchanging members and second of the electronic components. The primary heatsink and the crossflow cooler located in such way that the outflow opening is adjacent to the inlet, thus cooling air flows through the primary heatsink, the inlet, the heat-exchanging means, the radial impeller and the outlet in a series way.

The heat-spreading means are made like heat pipes and the heat-exchanging means and the heat-exchanging members are made like fin and/or pin-fin structures. The cover plate comprises an opening thus the top of the radial impeller is located at the same level with the cover plate. The cover is extended to a side of the crossflow cooler thus covering the heat-exchanging means. The cooling device further comprises a sealing located between the outflow opening and the inlet thus preventing an ambient air flows to the inlet directly. One of the side parts at the outlet is shaped like a volute. The side parts and the sidewalls are thermally connected by the heat pipes.

The general idea of the presented invention is to achieve maximum efficient direct cooling while using the crossflow cooler and primary heatsink for cooling its electronic component by providing the individual tight thermal contact to the attached electronic components. The crossflow cooler and the primary heatsink are hydraulically connected in a common system of airflow through the heat-exchanging means and heat-exchanging members and the inlet and outlet of the crossflow cooler. The linear and angular differences of the electronic components location including tolerances result in the different locations of the attached crossflow cooler and primary heatsink, and compensated by heat pipes ability to deform and keep such shape after assembly. The air flows through by one common radial impeller. Hermetic connection between primary heatsink outflow opening and crossflow cooler inlet allows the possibility to provide all air through heat-exchanging means and heat-exchanging members. In case when one of the electronic components, for example attached to the primary heatsink, operates at the higher clock speed and produce more heat that goes to the heat-exchanging members and farther spreads to the heat-exchanging means by heat pipes. As a result, the proposed multi-heatsink integrated cooling device has much higher efficiency than all known the same size and material coolers.

DETAILED DESCRIPTION OF THE INVENTION

Preferred embodiment of the present invention will be described in detail below with reference to the accompanying drawings.

Figure 1:
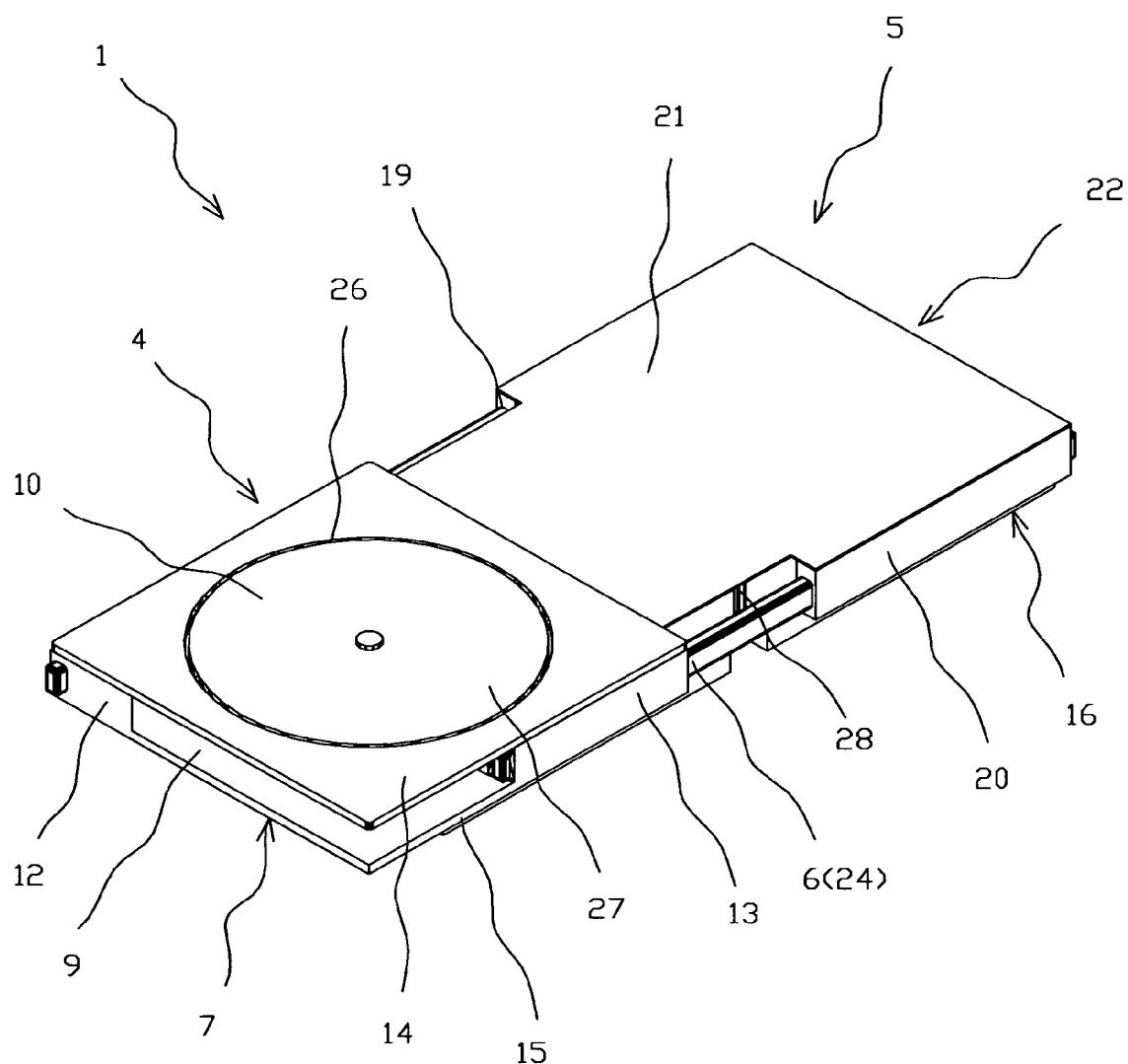
FIG. 1 is a perspective view showing the multi-heatsink integrated cooling device for electronic components by the present invention.
Figure 2:
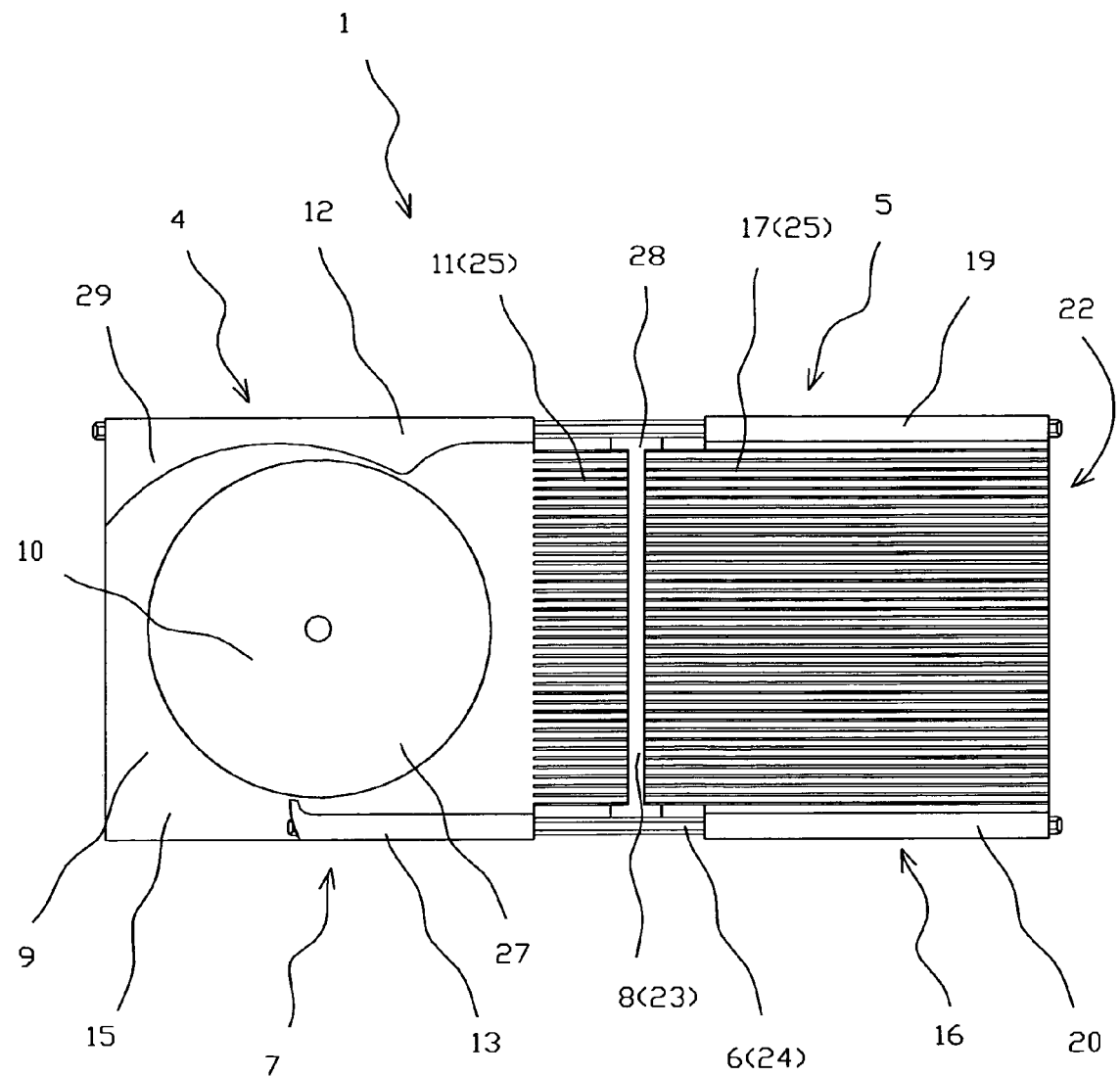
FIG. 2 is a top view of the multi-heatsink integrated cooling device (the cover and cover plate are removed).
Figure 3:
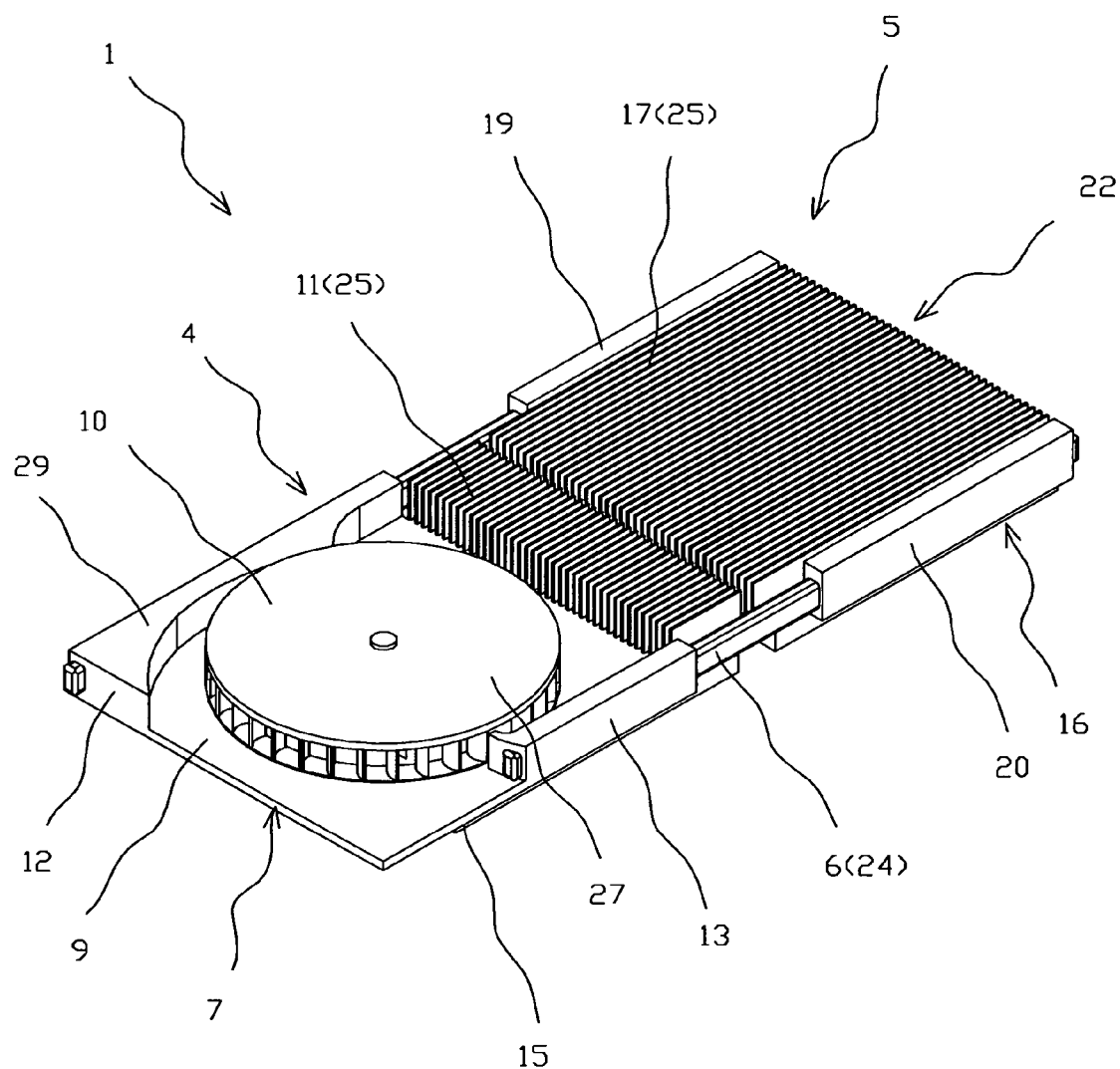
FIG. 3 is a perspective view showing the multi-heatsink integrated cooling device (the cover and cover plate are removed).
Figure 4:
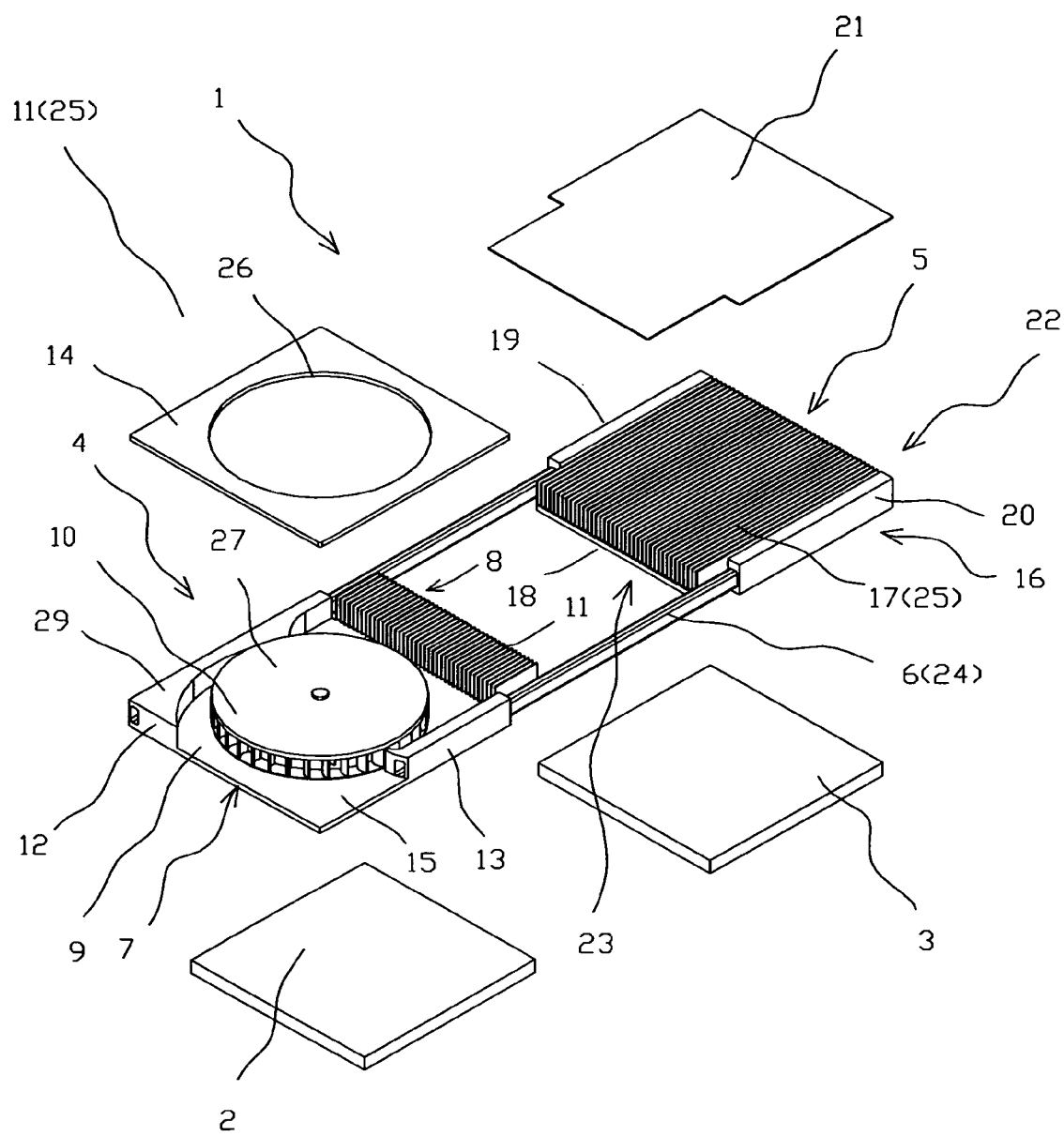
FIG. 4 is an exploded perspective view showing the multi-heatsink integrated cooling device.

FIGS. 1-4 show an embodiment of the present invention.

The multi-heatsink integrated cooling device 1 for at least two electronic components 2 and 3 comprises a crossflow cooler 4 and at least one primary heatsink 5 thermally connected by heat-spreading means 6. The crossflow cooler 4 comprises a casing 7 with an inlet 8 and an outlet 9, and a radial impeller 10 and heat-exchanging means 11 located inside of the casing 7. The crossflow cooler 4 supplied by an electric motor (not shown on Figs.) which could be made of any conventional types but known flat electric drives are preferable. The flat electric drive disclosed in the U.S. Pat. No. 6,664,673 "Cooler for Electronic Devices" it the most preferable due to its ability to leave a free space inside the radial impeller 10 that is especially important when crossflow blower is used.

The casing 7 comprises two side parts 12 and 13, a cover plate 14 and a lower plate 15. The lover plate 15 located on the upper surface of the electronic component 2 by conventional attached mechanism (not shown on Figs.) thus provided a thermal contact with the heat exchanging means 11 and first of the electronic components 2. The side part 12 at the outlet 9 is shaped like a volute 29 thus enhanced the airflow ability of the crossflow cooler 4.

The primary heatsink 5 comprises a housing 16 and heat-exchanging members 17 located inside of the housings 16. The housing 16 comprises a base 18, two sidewalls 19 and 20 and a cover 21, thus forming inflow and outflow openings 22 and 23. The base 18 located on the upper surface of the electronic components 3 by conventional attached mechanism (not shown on Figs.) thus provided a thermal contact with the heat exchanging members 17 and second of the electronic component 3. The primary heatsink 5 and the crossflow cooler 4 located in such a way that the outflow opening 23 is adjacent to the inlet 8, thus cooling air flows through the primary heatsink 5, the inlet 8, the heat-exchanging means 6, the radial impeller 10 and the outlet 9 in a series way.

The heat-spreading means 6 are made like heat pipes 24 and the heat-exchanging means 11 and the heat-exchanging members 17 are made like fin and/or pin-fin structures 25. The cover plate 14 comprises an opening 26 thus the top 27 of the radial impeller 10 is located at the same level with the cover plate 14. The cover 21 is extended to a side of the crossflow cooler 4 thus covering the heat-exchanging means 11. The cooling device 1 further comprises a sealing 28 located between the outflow opening 23 and the inlet 8 thus preventing an ambient air flows to the inlet 8 directly. The side parts 12 and 13 and the sidewalls 19 and 20 are thermally connected by the heat pipes 24.

The preferred embodiment achieve maximum efficient direct cooling of electronic components 2 and 3 while using the crossflow cooler 4 and primary heatsink 5 by providing the individual tight thermal contact between the lower plate 15, of the crossflow cooler 4 and the base 18 of the primary heatsink 5 and the cooling electronic components 2 and 3 correspondingly.

The linear and angular differences of the electronic components 2 and 3 location including tolerances result in the different locations of the attached crossflow cooler 4 and primary heatsink 5, and compensated by heat pipes 24 ability to deform and keep such shape after assembly.

When there are more than two electronic components to be cooling an additional primary heatsink (not shown on Figs.) can be installed and thermally connected in analogous matter with third electronic component (not shown on Figs.) and the primary heatsink 5 from the side opposite to the crossflow cooler 4.

The crossflow cooler 4 and the primary heatsink 5 are hydraulically connected in a common system of airflow through the heat-exchanging means 6 and heat-exchanging members 17 and the inlet 8 and outlet 9 of the one common radial impeller 10. Hermetic connection by using the sealing 28 between the outflow opening 23 of the primary heatsink 5 and the inlet 8 allows the possibility to provide all air through heat-exchanging means 6 and heat-exchanging members 17 in a series way. When one of the electronic components, for example electronic component 3 attached to the primary heatsink 5, operates at the higher clock speed and produce more heat that goes to the heat-exchanging members 17 and farther spreads to the heat-exchanging means 6 by heat pipes 24.

As a result, the proposed multi-heatsink integrated cooling device 1 for at least two electronic components 2 and 3 has much higher efficiency than all known the same size and material coolers.

We claim:

1. A multi-heatsink integrated cooling device for at least two electronic components comprising a crossflow cooler and at least one primary heatsink thermally connected by flexible heat-spreading means, wherein:
   (i) said crossflow cooler comprising a casing with an inlet and an outlet, and a radial impeller and heat-exchanging means located inside of said casing;
   (ii) said casing comprising two side parts, a cover plate and a lower plate provided a thermal contact with said heat exchanging means and first of said electronic components;
   (iii) said primary heatsink comprising a housing and heat-exchanging members located inside of said housing;
   (iv) said housing comprising a base, two sidewalls and a cover, thus forming inflow and outflow openings, said base being provided a thermal contact with said heat exchanging members and second of said electronic components;
   (v) said primary heatsink and said crossflow cooler being located in such a way that said outflow opening being adjacent to said inlet, thus cooling air flows plane-parallel through said primary heatsink, said inlet, said heat-exchanging means, said radial impeller and said outlet in a series way.

2. The cooling device as claimed in claim 1, wherein said flexible heat-spreading means being made like heat-pipes.

3. The cooling device as claimed in claim 1, wherein said heat exchanging means and said heat exchanging members being made like fin and/or pin-fin structures.

4. The cooling device as claimed in claim 1, wherein said cover plate comprising an opening thus the top of said radial impeller being located at the same level with said cover plate.

5. The cooling device as claimed in claim 1, wherein said cover being extended to a side of said crossflow cooler thus being covering said heat-exchanging means.

6. The cooling device as claimed in claim 1, wherein said cooling device further comprising a sealing located between said outflow opening and said inlet thus being prevent an ambient air flows to said inlet directly.

7. The cooling device as claimed in claim 1, wherein one of said side parts at said outlet being shaped like a volute.

8. The cooling device as claimed in claim 2, wherein said side parts and said sidewalls being thermally connected by said heat-pipes.

* * * * *